US 6,640,095 B2

(12) United States Patent
Nakajima et al.

(10) Patent No.: US 6,640,095 B2
(45) Date of Patent: Oct. 28, 2003

(54) FREQUENCY MULTIPLIER AND WIRELESS DEVICE INCORPORATING SAME

(75) Inventors: Norio Nakajima, Takatsuki (JP); Harufumi Mandai, Takatsuki (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 24 days.

(21) Appl. No.: 10/147,235

(22) Filed: May 15, 2002

(65) Prior Publication Data

US 2002/0132602 A1 Sep. 19, 2002

Related U.S. Application Data

(62) Division of application No. 09/492,926, filed on Jan. 27, 2000, now Pat. No. 6,456,836.

(30) Foreign Application Priority Data

Jan. 27, 1999 (JP) ............................................. 11-18702

(51) Int. Cl.[7] .................................................. H04B 1/26
(52) U.S. Cl. ...................... 455/323; 455/118; 455/323; 455/313; 327/113
(58) Field of Search ................................ 455/319, 313, 455/316, 323, 318, 317, 326, 333, 325, 327, 328, 260, 261, 76, 264; 327/113, 114, 115, 116, 105, 107, 119, 156; 331/16, 53, 76; 333/175, 101, 102, 103, 218, 76, 178

(56) References Cited

U.S. PATENT DOCUMENTS

| 3,921,056 A | * | 11/1975 | Mahoney ..................... 333/218 |
| 4,712,073 A | * | 12/1987 | Van Rumpt et al. ......... 327/119 |
| 4,876,739 A | * | 10/1989 | Ma et al. ..................... 455/266 |
| 4,931,921 A | * | 6/1990 | Anderson ..................... 363/163 |
| 5,392,014 A | * | 2/1995 | Nishida et al. .............. 333/218 |
| 5,514,990 A | * | 5/1996 | Mukaine et al. ............. 327/116 |
| 5,634,207 A | * | 5/1997 | Yamaji et al. ............... 455/323 |
| 6,066,997 A | * | 5/2000 | Matsugatani et al. ........ 333/218 |
| 6,198,365 B1 | * | 3/2001 | Yamada ....................... 333/218 |
| 6,229,357 B1 | * | 5/2001 | Nair et al. ................... 327/115 |

FOREIGN PATENT DOCUMENTS

| JP | 52119158 | 10/1977 |
| JP | 63310205 | 12/1988 |
| JP | 10117110 | 5/1998 |

OTHER PUBLICATIONS

Japanese Examination Report dated Jun. 11, 2002, along with the English translation.

* cited by examiner

Primary Examiner—Pablo Tran
(74) Attorney, Agent, or Firm—Keating & Bennett, LLP

(57) ABSTRACT

A compact frequency multiplier can perform high-degree frequency multiplication and can be incorporated in a wireless device. The frequency multiplier includes an input terminal for inputting an input signal, a first resonant circuit resonating with the frequency ω of the input signal, a second resonant circuit and an idler circuit, which resonate with the frequency n·ω that is, n times the frequency of the input signal, a variable reactor such as a varactor diode, coupling-adjusting capacitors, a bias resistor, and an output terminal for outputting multiplied output signals. In one embodiment, the frequency multiplier is a current-excitation type. The first resonant circuit and the second resonant circuit, each of which is constituted of an LC series resonant circuit, are connected in series between the input terminal and the output terminal. In addition, a parallel circuit constituted of the idler circuit and the varactor diode is connected to a connection point between the first and second resonant circuits and the input terminal and the output terminal.

5 Claims, 5 Drawing Sheets

FREQUENCY MULTIPLIER AND WIRELESS DEVICE INCORPORATING SAME

CROSS REFERENCE TO RELATED APPLICATIONS

This is a divisional of U.S. patent application Ser. No. 09/492,926, filed Jan. 27, 2000 now U.S. Pat. No. 6,456,836 in the name of Norio NAKAJIMA and Harufumi MANDAI entitled FREQUENCY MULTIPLIER AND WIRELESS DEVICE INCORPORATING SAME.

BACKGROUND OF THE INVENTION

1. Field of the Invention

The present invention relates to a frequency multiplier for use in a local oscillator and to a wireless device incorporating the same.

2. Description of the Related Art

A known prior art frequency multiplier provides an output having a frequency which is an integral multiple of an input signal by generating harmonic components by operating a transistor as a Class-C amplifier.

FIG. 6 is a circuit diagram showing a schematic structure of a prior art frequency multiplier. A frequency multiplier 50 includes an input terminal 51 for inputting an input signal, a front-stage coupling circuit 52, a terminal 53, to which a positive power supply is connected, a transistor 54, a final-stage coupling circuit 55, and an output terminal 56.

In the frequency multiplier 50, firstly, an input signal of a frequency ω, which is input from the input terminal 51, is input to the transistor 54 via the front-stage coupling circuit 52. The transistor 54 is not used for amplification in its linear region, as in typical cases. It is employed in a Class-C operation using a small bias or no bias. As shown in FIG. 6, when using a Si bipolar transistor as the transistor 54 with its emitter grounded, almost no collector current flows unless the base voltage is higher than 0.6 V. As a result, since the portion of the input waveform during which the collector current flows is limited, the output waveform from the collector is distorted to include harmonic components. The signals output from the collector of the transistor 54 are output from the output terminal 56 via the final-stage coupling circuit 55.

In the prior art frequency multiplier having a transmitter driven in Class-C operation the collector efficiency (the ratio of the collector current to the emitter current) of the transistor is low. A limitation is that the frequency in a single frequency multiplier is multiplied by a factor of four at most. When the multiplication factor is larger, the number of stages of frequency multipliers must be increased. As a result, the size of the component increases, which leads to higher cost.

SUMMARY OF THE INVENTION

To overcome the above described problems, embodiments of the present invention provide a compact frequency multiplier capable of performing high-degree multiplication and a wireless device incorporating the same.

One embodiment of the present invention provides a frequency multiplier including a first resonant circuit resonating with the frequency of an input signal, a second resonant circuit and an idler circuit both resonating with a frequency n times that of the input signal, and a variable reactor. The first and second resonant circuits are connected in series between an input and an output, and a parallel circuit constituted of the idler circuit and the variable reactor is connected in parallel between the input and the output so as to form a current-excitation frequency multiplier. The idler circuit is contained in a multi-layer substrate formed of a plurality of dielectric layers, on which the variable reactor is mounted.

According to the above described frequency multiplier, since the idler circuit constituting the frequency multiplier is contained in the multi-layer substrate, the idler circuit can have a high Q value. Thus, a high-efficiency frequency multiplier can be produced. Also, high-degree multiplication can be achieved while maintaining high efficiency.

Another embodiment of the present invention provides a frequency multiplier including a first resonant circuit resonating with the frequency of an input signal, a second resonant circuit and an idler circuit both resonating with a frequency n times that of the input signal, and a variable reactor. The first resonant circuit and the second resonant circuit are connected in parallel between an input and an output, and a parallel circuit constituted of the idler circuit and the variable reactor is connected in series between the input and the output so as to form a voltage-excitation frequency multiplier. The idler circuit is contained in a multi-layer substrate formed of a plurality of dielectric layers, on which the variable reactor is mounted.

According to the above described frequency multiplier, since the idler circuit constituting the frequency multiplier is contained in the multi-layer substrate, the idler circuit can have a high Q value. Thus, a high-efficiency frequency multiplier can be produced. Also, high-degree multiplication can be achieved while maintaining high efficiency.

In addition, since this frequency multiplier is a voltage-excitation type, higher-degree multiplication can be performed by utilizing a higher-mode excited frequency.

In the above described frequency multipliers, at least one of the first resonant circuit and the second resonant circuit disposed in one of the above-described frequency multipliers may be contained in the multi-layer substrate. Thus, variations in the frequency of the tuning circuit can be suppressed. Accordingly, a frequency multiplier having better characteristics can be produced.

Yet another preferred embodiment of the present invention provides a wireless device which incorporates one of the above-described frequency multipliers.

The above-described wireless device can perform high-degree multiplication with a single unit and has high efficiency, with the result that the size of the wireless device can be reduced and high efficiency is obtainable.

Other features and advantages of the present invention will become apparent from the following description of the invention which refers to the accompanying drawings.

DESCRIPTION OF EMBODIMENTS OF THE INVENTION

A description will be given of two embodiments of the present invention with reference to the drawings.

Figure 1:
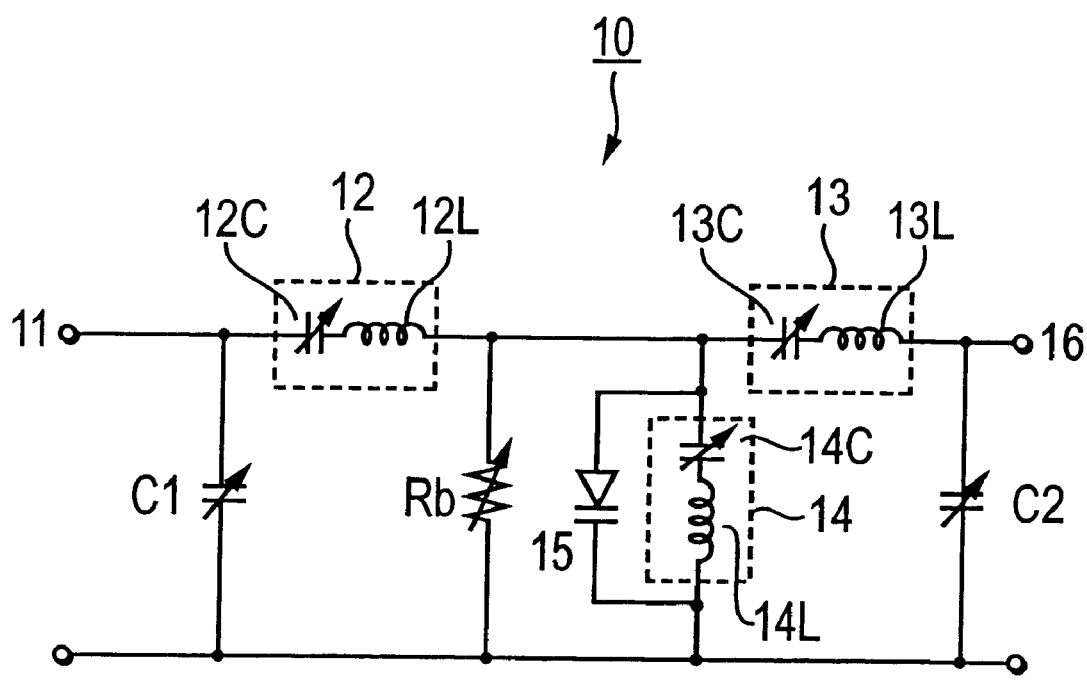
FIG. 1 is a circuit diagram illustrating a schematic structure of a frequency multiplier according to a first embodiment of the present invention.

FIG. 1 shows a circuit diagram illustrating a schematic structure of a frequency multiplier according to a first embodiment of the present invention. A frequency multiplier 10 includes an input terminal 11 for inputting an input signal, a first resonant circuit 12 resonating with the frequency ω of the input signal, a second resonant circuit 13 and an idler circuit 14, which resonate with the frequency n·ω, that is, n times that of the input signal, a variable reactor 15, which in this embodiment is a varactor diode, coupling-adjusting variable capacitors C1 and C2, a variable bias resistor Rb, and an output terminal 16 for outputting a multiplied output signal.

Since the frequency multiplier 10 is a current-excitation type, the first resonant circuit 12 and the second resonant circuit 13 are each constituted of an LC series resonant circuit and are connected in series between the input terminal 11 and the output terminal 16. In addition, a parallel circuit constituted of the idler circuit 14 and the varactor diode 15 is connected to a connection point between the input terminal 11 and the output terminal 16 and between the first and second resonant circuits.

In the frequency multiplier 10, when an input signal of a frequency ω passes through the varactor diode 15 via the first resonant circuit 12, which allows only the signals of the frequency ω to be passed, a plurality of harmonics of the input signals is generated. Only the frequency n·ω, with which the idler circuit 14 resonates, that is n times that of the input signal, is extracted from the harmonics, and is then output as the n-multiplied output signal from the output terminal 16 via the second resonant circuit 13, which allows only the signals of the frequency n·ω to be passed.

Therefore, for example, if the second resonant circuit 13 and the idler circuit 14 are set to resonate with a frequency 3·ω that is, three times the frequency of the input signal, an output signal with the frequency multiplied by a factor of 3 can be extracted from the output terminal 16.

Figure 2A:
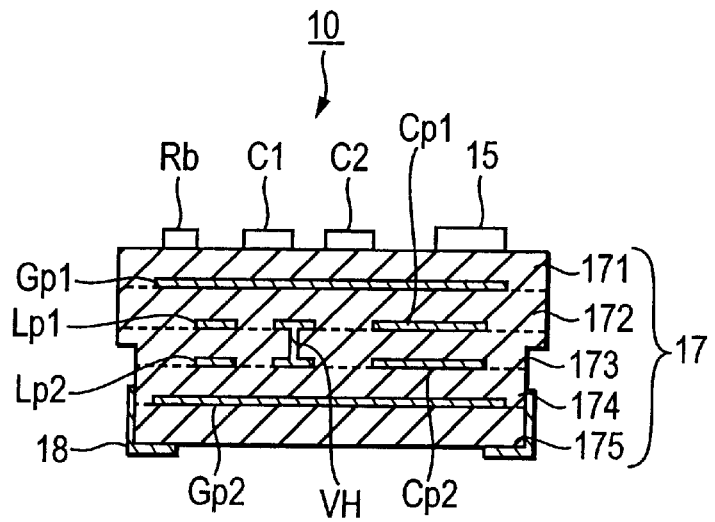
FIG. 2A is a sectional view of a structure of the frequency multiplier shown in FIG. 1.
Figure 2B:
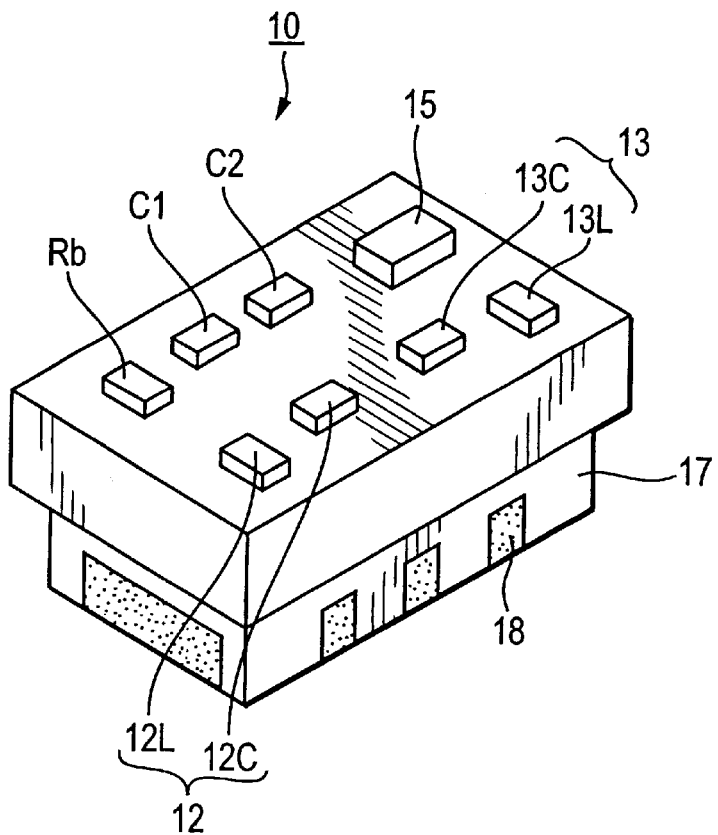
FIG. 2B is a perspective view thereof.

FIGS. 2A and 2B show a sectional view and a perspective view illustrating a structure of the frequency multiplier shown in FIG. 1. The idler circuit 14 of the frequency multiplier 10 includes a multi-layer substrate 17 having a plurality of outer electrodes 18 on bottom edges of the substrate extending from the bottom to the sides of the substrate. The multi-layer substrate 17 having such a structure is, for example, produced by the following method.

Dielectric layers 171 to 175 are prepared by laminating green sheets formed of a low-temperature sintered ceramic material. Then, on the dielectric layers 171 to 175, capacitor electrodes Cp1 and Cp2 constituting the capacitor 14C of the idler circuit 14, inductor electrodes Lp1 and Lp2 constituting the inductor 14L of the idler circuit 14, ground electrodes Gp1 and Gp2, and a wiring pattern (not shown) are screen-printed by using copper paste.

Next, a via-hole electrode VH is arranged. Copper paste is filled in the hole for forming the via-hole electrode. The dielectric layers 171 to 175 obtained in this way are laminated by pressing. Next, the multi-layered structure is baked for about one hour at 960° C. in a neutral or weak reducing atmosphere, and copper paste is applied on predetermined parts of the bottom edges of the structure and baked so as to form the plurality of outer electrodes 18.

Furthermore, on the flat top surface of the multi-layer substrate 17, the varactor diode 15, the first resonant circuit 12 comprising a capacitor 12C and an inductor 12L, the second resonant circuit 13 comprising a capacitor 13C and an inductor 13L, the coupling-adjusting capacitors C1 and C2, and the bias resistor Rb, are mounted to complete the frequency multiplier 10. One of the plurality of outer electrodes 18 is used as the input terminal 11 and another is used as the output terminal 16, although this is not shown in the figure.

Figure 3A:
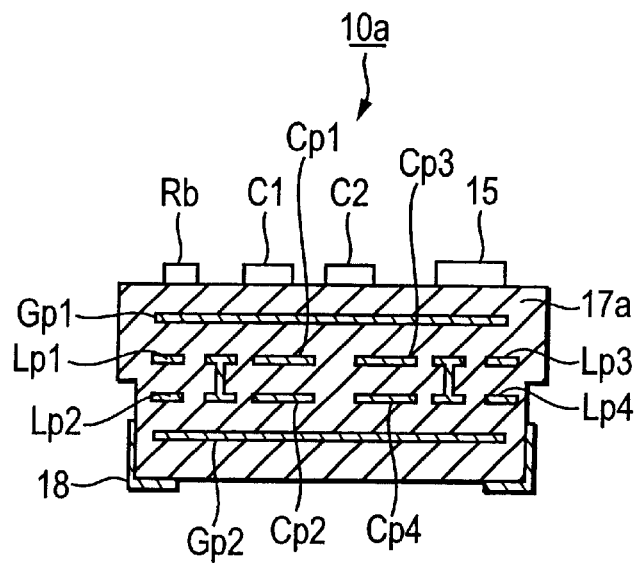
FIG. 3A is a sectional view of another structure of the frequency multiplier shown in FIG. 1.
Figure 3B:
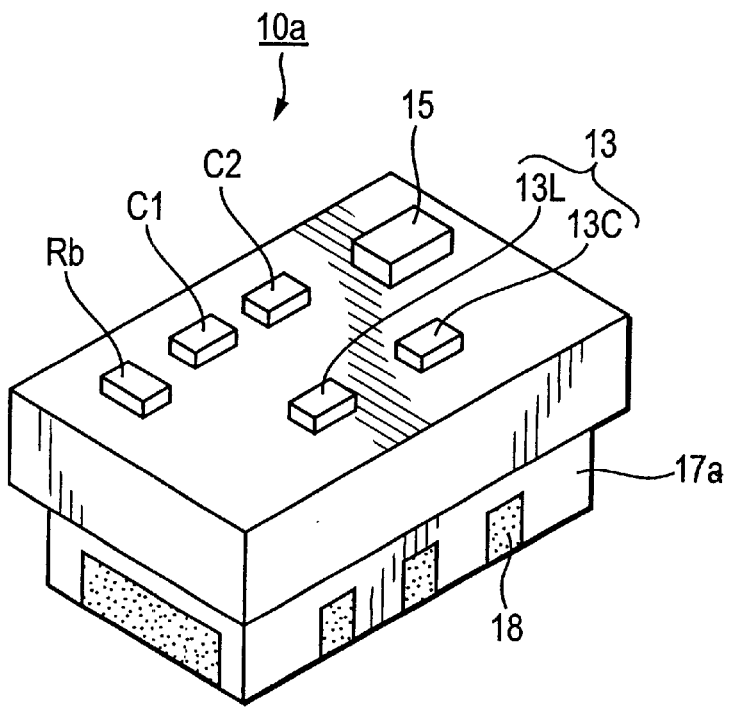
FIG. 3B is a perspective view thereof.

FIGS. 3A and 3B show a sectional view and a perspective view illustrating another structure of the frequency multiplier shown in FIG. 1. The frequency multiplier 10a is different from the frequency multiplier 10 shown in FIG. 2 in that capacitor electrodes Cp3 and Cp4 and inductor electrodes Lp3 and Lp4, which constitute the capacitor and the inductor of the first resonant circuit 12 respectively, are also contained in the multi-layer substrate 17a, along with the idler circuit 14.

Of course, the second resonant circuit 13, or both resonant circuits 12 and 13, could be contained in the multilayer substrate.

As described above, in the frequency multiplier according to the first embodiment, since the idler circuit constituting the frequency multiplier is contained in the multi-layer substrate, the idler circuit can have a high Q value. Accordingly, a high-efficiency frequency multiplier is obtainable. That is, high-degree multiplication can be achieved while maintaining high efficiency.

Furthermore, as shown in FIG. 3, when the first resonant circuit is also contained in the multi-layer substrate, variations in the frequency of the first tuning circuit can be suppressed. Thus, a frequency multiplier having better characteristics can be produced.

Figure 4:
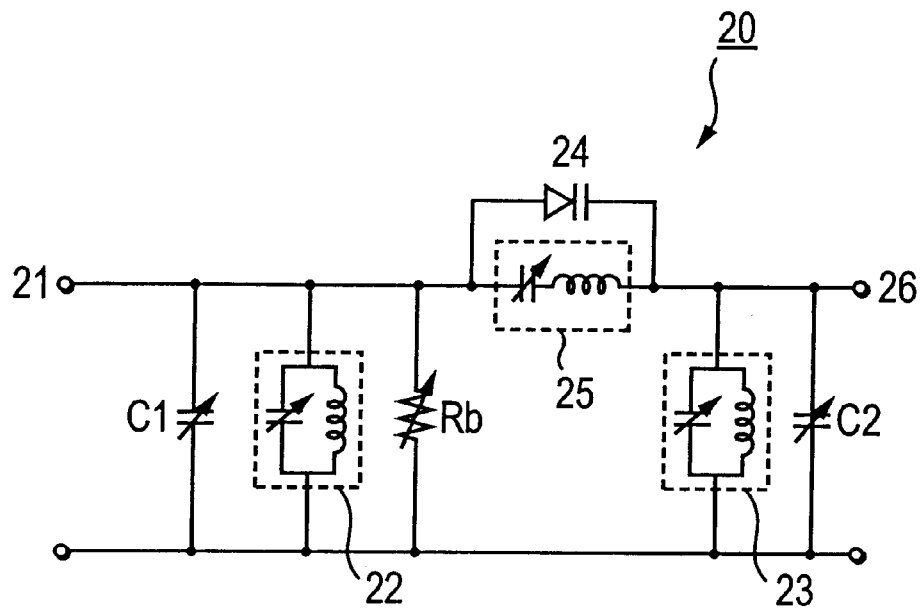
FIG. 4 is a circuit diagram of a schematic structure of a frequency multiplier according to a second embodiment of the present invention.

FIG. 4 is a circuit diagram showing a schematic structure of a frequency multiplier according to a second embodiment of the present invention. The frequency multiplier 20 includes an input terminal 21 for inputting an input signal, a first resonant circuit 22 resonating with the frequency ω of the input signal, a second resonant circuit 23 and an idler circuit 24 resonating with the frequency n·ω that is, n times that of the input signal, a variable reactor which in this embodiment is a varactor diode 25, coupling-adjusting capacitors C1 and C2, a bias resistor Rb, and an output terminal 26 for outputting a multiplied output signal.

Since the frequency multiplier 20 is a voltage-excitation type, the first resonant circuit 22 and the second resonant circuit 23 are each constituted of an LC parallel resonant circuit, and are connected in parallel to connection points between the input terminal 21 and the output terminal 26. In addition, a parallel circuit constituted of the idler circuit 24 and the varactor diode 25 is connected in series between those connection points and between the input terminal 21 and the output terminal 26.

The frequency multiplier 20 operates in the same manner as that of the frequency multiplier 10 shown in FIG. 1. Furthermore, the structure of the frequency multiplier 20 includes a multi-layer substrate as in the case of the first embodiment shown in FIGS. 2A–2B.

In the frequency multiplier according to the above-described second embodiment, since the idler circuit constituting the frequency multiplier is contained in the multi-layer substrate, the idler circuit can have a high Q value. Accordingly, a high-efficiency frequency multiplier can be produced, in which high-degree multiplication can be achieved while maintaining high efficiency.

Moreover, since it is a voltage-excitation type, a frequency multiplier in which even higher-degree multiplication can be performed by utilizing a higher-mode excited frequency.

Figure 5:
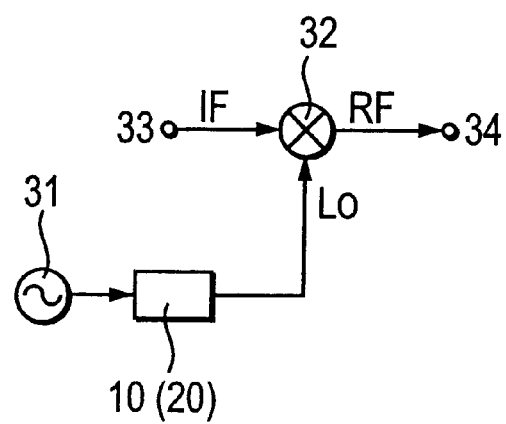
FIG. 5 is a block diagram in a case where the frequency multiplier shown in FIG. 1 or 3 is used as a local oscillator in the transmission system of a wireless device.
Figure 6:
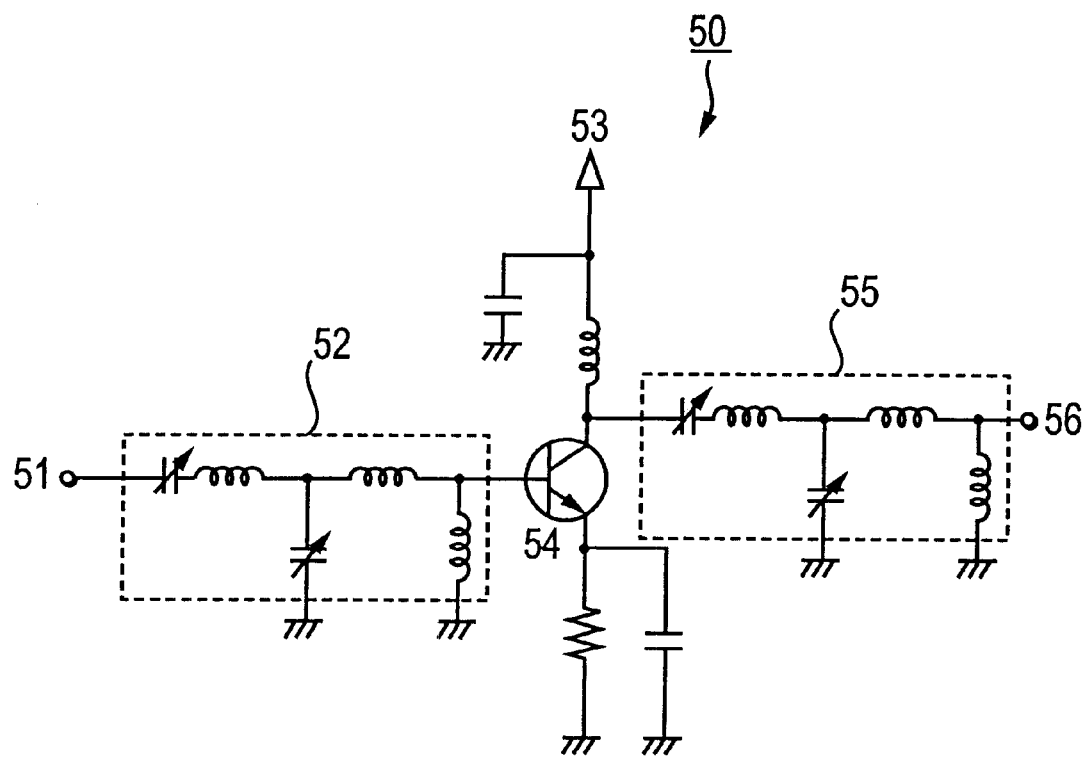
FIG. 6 is a circuit diagram of a prior art frequency multiplier.

FIG. 5 is a block diagram where the frequency multiplier shown in FIG. 1 or 4 is used in a local oscillator in the transmission system of a wireless device. In the frequency multiplier 10 (20), the output of an oscillator 31 is multiplied by a factor of n to obtain a local oscillation signal Lo, which is input to a mixer 32 to be mixed with signals from an IF input terminal 33. The product of the IF and Lo signals is then output from an RF output terminal 34.

In the frequency multiplier 10, n is set to be 9 so as to form a frequency multiplier which multiplies by a factor of 9. In this case, a crystal oscillator of 14.4 MHZ is used as the oscillator 31 to obtain the local oscillation signal Lo of a frequency 129.6 MHZ.

In the wireless device having the above-described structure, since a frequency multiplier capable of performing high-degree multiplication in a single unit is used, the size of the wireless device incorporating the frequency multiplier can be reduced.

Although the above first and second embodiments use a varactor diode as the variable reactor, a step-recovery diode can be used as an alternative. When a step-recovery diode is used, since the range of the voltage used can be extended in the forward region, an abundance of harmonic components can be generated, with the result that the diode is suitable for higher-degree frequency multipliers.

While the invention has been particularly shown and described with reference to embodiments thereof, it will be understood by those skilled in the art that the foregoing and other changes in form and details may be made therein without departing from the spirit of the invention.

What is claimed is:

1. A frequency multiplier comprising:
   a first resonant circuit resonating with a frequency of an input signal;
   a second resonant circuit resonating with a frequency n times that of the input signal;
   an idler circuit resonating with the frequency n times that of the input signal; and
   a variable reactor;
   wherein the first resonant circuit and the second resonant circuit are connected in parallel to connection points disposed between an input and an output, and a parallel circuit constituted of the idler circuit and the variable reactor is connected in series between said connection points and between the input and the output so as to form a voltage-excitation frequency multiplier; and
   wherein the idler circuit is contained in a multi-layer substrate formed of a plurality of dielectric layers, on which the variable reactor is mounted.

2. A frequency multiplier according to claim 1, wherein at least one of the first resonant circuit and the second resonant circuit is contained in the multi-layer substrate.

3. A wireless device comprising a circuit which includes one of a transmitter and a receiver,
   said circuit comprising an oscillator, and further comprising a frequency multiplier which multiplies an output frequency of said oscillator and supplies a frequency-multiplied signal to another component of said circuit,
   the frequency multiplier comprising:
   a first resonant circuit resonating with a frequency of an input signal;
   a second resonant circuit resonating with a frequency n times that of the input signal;
   an idler circuit resonating with the frequency n times that of the input signal; and
   a variable reactor;
   wherein the first resonant circuit and the second resonant circuit are connected in parallel to a connection point disposed between an input and an output, and a parallel circuit constituted of the idler circuit and the variable reactor is connected in series between said connection point and between the input and the output so as to form a voltage-excitation frequency multiplier; and
   wherein the idler circuit is contained in a multi-layer substrate formed of a plurality of dielectric layers, on wtiich the variable reactor is mounted.

4. The wireless device according to claim 3, wherein at least one of the first resonant circuit and the second resonant circuit is contained in the multi-layer substrate.

5. The wireless device according to claim 3, wherein said another component is a mixer, said frequency-multiplied signal is a local oscillation signal, and said mixer combines an IF signal with the local oscillation signal and outputs an RF signal.

* * * * *